(12) United States Patent
Steiner et al.

(10) Patent No.: US 10,890,385 B2
(45) Date of Patent: Jan. 12, 2021

(54) APPARATUS AND SYSTEM FOR EXCHANGING HEAT WITH A FLUID

(71) Applicant: Etalim Inc., Vancouver (CA)

(72) Inventors: Thomas Walter Steiner, Burnaby (CA); Michael Hoy, Burnaby (CA); Geoffrey Donald Stalker Archibald, Vancouver (CA); Kristjan Gottfried, Richmond (CA); Takao Kanemaru, Port Coquitlam (CA); Briac Medard De Chardon, Vancouver (CA)

(73) Assignee: ETALIM INC., Burnaby (CA)

( * ) Notice: Subject to any disclaimer, the term of this patent is extended or adjusted under 35 U.S.C. 154(b) by 265 days.

(21) Appl. No.: 16/071,050

(22) PCT Filed: Jan. 18, 2017

(86) PCT No.: PCT/CA2017/000010
§ 371 (c)(1),
(2) Date: Jul. 18, 2018

(87) PCT Pub. No.: WO2017/124176
PCT Pub. Date: Jul. 27, 2017

(65) Prior Publication Data
US 2019/0033014 A1    Jan. 31, 2019

Related U.S. Application Data

(60) Provisional application No. 62/281,548, filed on Jan. 21, 2016.

(51) Int. Cl.
*F28F 3/12* (2006.01)
*F28F 21/02* (2006.01)
(Continued)

(52) U.S. Cl.
CPC ............... *F28F 3/12* (2013.01); *F02G 1/053* (2013.01); *F28F 3/022* (2013.01); *F28F 3/048* (2013.01);
(Continued)

(58) Field of Classification Search
CPC .... F28F 3/12; F28F 3/022; F28F 3/048; F28F 3/02; F28F 7/02; F28F 13/003;
(Continued)

(56) References Cited

U.S. PATENT DOCUMENTS 5,016,090 A    5/1991  Galyon et al.
5,095,973 A *  3/1992  Toy ..................... F28D 9/0062
                                                            165/185
(Continued)

FOREIGN PATENT DOCUMENTS

CN    102052807 A    5/2011
CN    104266531 A    1/2015
DE    10244805 A1    4/2004

OTHER PUBLICATIONS

Leclaire, Thomas, European Patent Office, Extended European Search Report, in connection with related European Patent Application No. 17740923.2, dated Aug. 22, 2019, 10 pages.
(Continued)

*Primary Examiner* — Devon Russell (57) ABSTRACT

An apparatus for exchanging heat with a fluid includes a heat exchanger having first and second opposing surfaces and a plurality of flow passages permitting axial fluid flow between the surfaces. A manifold having an interface surface is in thermal contact with the first surface and includes a thermally conductive body for conducting heat in an axial direction between the interface surface and a heat transmitting surface. A plurality of feed passages extend through the thermally conductive body in a transverse direction, the
(Continued)

passages having an inlet for receiving or discharging fluid. A plurality of distribution passages have ends in fluid communication with at least one of the feed passages and openings distributed over the interface surface. The distribution passages are configured to cause a change in fluid flow direction between a transversely directed flow in the feed passages and an axially directed flow at the openings.

29 Claims, 3 Drawing Sheets

(51) Int. Cl.
| | | |
|---|---|---|
| F02G 1/053 | (2006.01) | |
| F28F 3/02 | (2006.01) | |
| F28F 3/04 | (2006.01) | |
| F28F 13/08 | (2006.01) | |
| F28F 21/04 | (2006.01) | |
| F28F 21/08 | (2006.01) | |
| H01L 23/467 | (2006.01) | |
| F28F 13/10 | (2006.01) | |
| F28F 13/00 | (2006.01) | |
| F28F 7/02 | (2006.01) | |
| F28D 21/00 | (2006.01) | |

(52) U.S. Cl.
CPC .............. *F28F 7/02* (2013.01); *F28F 13/003* (2013.01); *F28F 13/08* (2013.01); *F28F 13/10* (2013.01); *F28F 21/02* (2013.01); *F28F 21/04* (2013.01); *F28F 21/08* (2013.01); *H01L 23/467* (2013.01); *F25B 2309/1403* (2013.01); *F25B 2309/1412* (2013.01); *F28D 2021/0028* (2013.01); *F28D 2021/0077* (2013.01); *F28F 2215/10* (2013.01)

(58) Field of Classification Search
CPC .. F28F 13/10; F28F 21/02; F28F 21/04; F28F 21/08; F28F 2021/0028; F28F 2021/0077; F28F 2215/10; F28F 9/0282
See application file for complete search history.

(56) References Cited

U.S. PATENT DOCUMENTS

| | | | | |
|---|---|---|---|---|
| 5,303,555 | A | | 4/1994 | Chrysler et al. |
| 5,457,956 | A | | 10/1995 | Bowman et al. |
| 5,518,071 | A | * | 5/1996 | Lee .......................... F28F 3/02 165/185 |
| 5,673,561 | A | * | 10/1997 | Moss ...................... F25B 9/145 62/467 |
| 6,018,459 | A | * | 1/2000 | Carlson ................. F28F 13/003 165/80.3 |
| 6,026,895 | A | * | 2/2000 | Moresco ............. H01L 23/3672 165/185 |
| 6,134,783 | A | * | 10/2000 | Bargman ................ B21C 23/20 29/890.03 |
| 6,926,071 | B2 | * | 8/2005 | Lee ..................... H01L 23/3677 165/80.3 |
| 7,357,173 | B2 | * | 4/2008 | Griesmayer ........ H01L 23/3677 165/80.3 |
| 7,549,460 | B2 | * | 6/2009 | East ........................ F28F 3/022 165/104.33 |
| 7,780,944 | B2 | | 8/2010 | Mathias et al. |
| 7,814,965 | B1 | * | 10/2010 | Spokoiny .............. H01L 23/467 165/104.33 |
| 7,911,791 | B2 | * | 3/2011 | Refai-Ahmed ....... H01L 23/427 165/121 |
| 9,151,544 | B2 | * | 10/2015 | Hwang ................... F28D 15/00 |
| 2003/0062151 | A1 | * | 4/2003 | Sauciuc .................. F28F 3/022 165/185 |
| 2003/0221814 | A1 | * | 12/2003 | Kamath .................. F28F 3/022 165/80.3 |
| 2004/0170513 | A1 | | 9/2004 | Nara et al. |
| 2005/0047105 | A1 | * | 3/2005 | Gedamu ............. H01L 23/3677 361/803 |
| 2007/0284081 | A1 | * | 12/2007 | Lee ........................ F28F 3/022 165/80.3 |
| 2008/0210405 | A1 | | 9/2008 | Datta et al. |
| 2009/0065178 | A1 | | 3/2009 | Kasezawa et al. |
| 2009/0321058 | A1 | | 12/2009 | Uchimura et al. |
| 2011/0180235 | A1 | | 7/2011 | Garimella et al. |
| 2011/0232885 | A1 | | 9/2011 | Kaslusky et al. |
| 2013/0174924 | A1 | | 7/2013 | Luo et al. |
| 2014/0174703 | A1 | | 6/2014 | Yoshioka et al. |
| 2014/0183403 | A1 | * | 7/2014 | Peterson ................. A47C 27/15 252/75 |
| 2015/0330718 | A1 | * | 11/2015 | St. Rock ............. F28D 15/0208 165/121 |
| 2017/0038162 | A1 | * | 2/2017 | Taylor ................. F28D 1/05316 |
| 2018/0058773 | A1 | * | 3/2018 | Adhiachari ............. F28F 3/022 |

OTHER PUBLICATIONS

International Search Report issued by the Canadian Intellectual Property Office in connection with International Patent Application No. PCT/CA2017/000010, dated Apr. 7, 2017, 3 pages.

Written Opinion of the International Searching Authority issued by the Canadian Intellectual Property Office in connection with International Patent Application No. PCT/CA2017/000010, dated Apr. 7, 2017, 3 pages.

\* cited by examiner

APPARATUS AND SYSTEM FOR EXCHANGING HEAT WITH A FLUID

BACKGROUND

1. Field

This disclosure relates generally to heat exchangers and more particularly to compact heat exchangers for exchanging heat with a fluid.

2. Description of Related Art

Heat exchangers are used to transfer heat between a heat source and a fluid. The heat source may for example be another fluid or an electrical or mechanical device. The relatively poor thermal conductivity of fluids, and particularly gaseous fluids, requires a heat exchange structure having a large surface area and small passage dimensions transverse to the flow direction. Heat exchangers are categorized as compact heat exchangers if the heat transfer area per unit volume is greater than about 400 $m^2/m^3$ and ultra-compact heat exchangers if the heat transfer area per unit volume is greater than about 10000 $m^2/m^3$. Heat exchange within the exchanger is also subject to dissipative losses such as viscous dissipation and relaxation losses for oscillating gas flows, which need to be considered in selecting the heat exchanger geometry.

There remains a need for compact and ultra-compact heat exchangers for many applications. In particular, there remains a need for heat exchangers suitable for use in thermoacoustic or Stirling cycle transducers.

SUMMARY

In accordance with one disclosed aspect there is provided an apparatus for exchanging heat with a fluid. The apparatus includes a heat exchanger having first and second opposing surfaces and a plurality of flow passages that permit fluid flow between the first and second surfaces in a substantially axial direction, the axial direction being perpendicular to the first and second surfaces. The apparatus also includes a manifold having an interface surface in thermal contact with the first surface of the heat exchanger. The manifold includes a thermally conductive body operable to conduct heat between the interface surface and a distally located heat transmitting surface in a heat flow direction generally aligned with the axial direction, the heat transmitting surface being fluid impermeable. The apparatus further includes a plurality of feed passages extending through the thermally conductive body in a generally transverse direction with respect to the axial direction, each feed passage having an inlet for receiving or discharging the fluid. The apparatus also includes a plurality of distribution passages, each distribution passage having an end in fluid communication with at least one of the plurality of feed passages and having an opening at the interface surface, the respective openings of the plurality of distribution passages being distributed over the interface surface, the distribution passages may be configured to cause a change in fluid flow direction between a transversely directed flow in the feed passages and an axially directed flow at the openings of the distribution passages.

The heat exchanger may include an ultra-compact heat exchanger material.

The heat exchanger may have a heat transfer area per unit volume of greater than about 10000 $m^2/m^3$.

The heat exchanger material may include a high thermal conductivity fluid permeable material including at least one of a sintered powder, a wire felt, a metal foam, a ceramic foam, a woven screen, and a bonded plurality of patterned foils.

The heat exchanger material may include a plurality of flocked fibers.

The plurality of flocked fibers may be oriented in a direction generally aligned with the axial direction.

The fibers may include at least one of carbon fibers and copper fibers.

The heat exchanger may include a heat exchanger material selected to provide a compliant second surface, the compliant second surface being operable to facilitate thermal contact for coupling between the second surface and an external fluid flow element.

The first and second opposing surfaces of the heat exchanger may be spaced apart by less than about 2 mm.

Each of the feed passages may have a cross sectional area that varies along a transverse length of the feed passage to cause a generally uniform feed to the distribution passages and a generally uniform flow through the openings at the interface surface.

A cross sectional area of feed passages in the plurality of feed passages may vary between feed passages to cause a generally uniform feed to the distribution passages and a generally uniform flow through the openings at the interface surface.

Each feed passage may have a plurality of distribution passages in fluid communication along a transverse length of the feed passage.

The plurality of distribution passages may extend in into the thermally conductive body in a lateral direction with respect to the feed passages.

A lateral width of the plurality of distribution passages may be increased above the feed passages and distribution passages that are adjacently located may merge below the interface surface such that the respective openings form a grill pattern extending across the interface surface.

The distribution passages may have a greater width in the lateral direction than a transverse direction along the feed passages.

The manifold may further include a port peripherally disposed to one side of the manifold for receiving or discharging fluid from the manifold and the inlet of at least some of the feed passages may be flared toward the port to smoothly direct fluid between the port and the feed passages.

The manifold may further include a port peripherally disposed to one side of the manifold for receiving or discharging fluid from the manifold and the respective inlets of the feed passages each have an inlet cross sectional area sized to cause a uniform distribution of the fluid between the plurality of feed passages.

The respective inlets of the plurality of feed passages may be disposed about at least a portion of a periphery of the manifold and may further include one or more ports in fluid communication with the respective inlets, the one or more ports being operable to receive or discharge fluid from the manifold.

The second surface of the heat exchanger may act as a further port for receiving or discharging fluid from the heat exchanger.

The distribution passages may be configured to deliver a generally uniform distribution of fluid flow at the interface surface by at least one of providing a sufficiently large number of distribution passages across the interface surface, and sizing respective distribution passages to cause a generally uniform flow through each of the plurality of distribution passages.

The openings may be regularly spaced across the interface surface.

At least a portion of the manifold including the plurality of distribution passages may be fabricated from a plurality of stacked and bonded layers of thermally conductive material, each of the plurality of layers being patterned to define portions of the respective distribution passages.

At least a portion of the manifold including the plurality of distribution passages may be fabricated by depositing thermally conductive material using a 3D printer.

The thermally conductive body may be defined by portions of the body that are not occupied by the plurality of feed passages and the plurality of distribution passages and the thermally conductive body being at least 30% of a cross-sectional area of the manifold.

The thermally conductive body may be configured to withstand forces due to an operating pressure difference across the impermeable heat transmitting surface.

The fluid flow may undergo a periodic change in direction.

A frequency associated with the periodic change in direction may be greater than about 250 Hz.

The apparatus may be used in one of a Stirling cycle transducer, a thermoacoustic transducer, a cooler for cooling a mechanical device, and a cooler for cooling an electrical circuit component.

In accordance with another disclosed aspect a system for transferring heat between a first fluid and a second fluid includes a first apparatus as defined above configured to exchange heat with the first fluid, and a second apparatus as defined above configured to exchange heat with the second fluid, and the heat transmitting surface of the first apparatus may be disposed in thermal contact with the heat transmitting surface of the second apparatus.

In accordance with another disclosed aspect there is provided a system including a first heat exchanger as defined above, and a thermal regenerator disposed in thermal contact with the second surface of the first heat exchanger.

The thermal regenerator may include first and second interfaces, the first interface being in thermal contact with the second surface of the first heat exchanger and the system may further include a second heat exchanger as defined above having the respective second surface disposed in thermal contact with the second interface of the regenerator.

Other aspects and features will become apparent to those ordinarily skilled in the art upon review of the following description of specific disclosed embodiments in conjunction with the accompanying figures.

BRIEF DESCRIPTION OF THE DRAWINGS

In drawings which illustrate disclosed embodiments.

DETAILED DESCRIPTION

Figure 1:
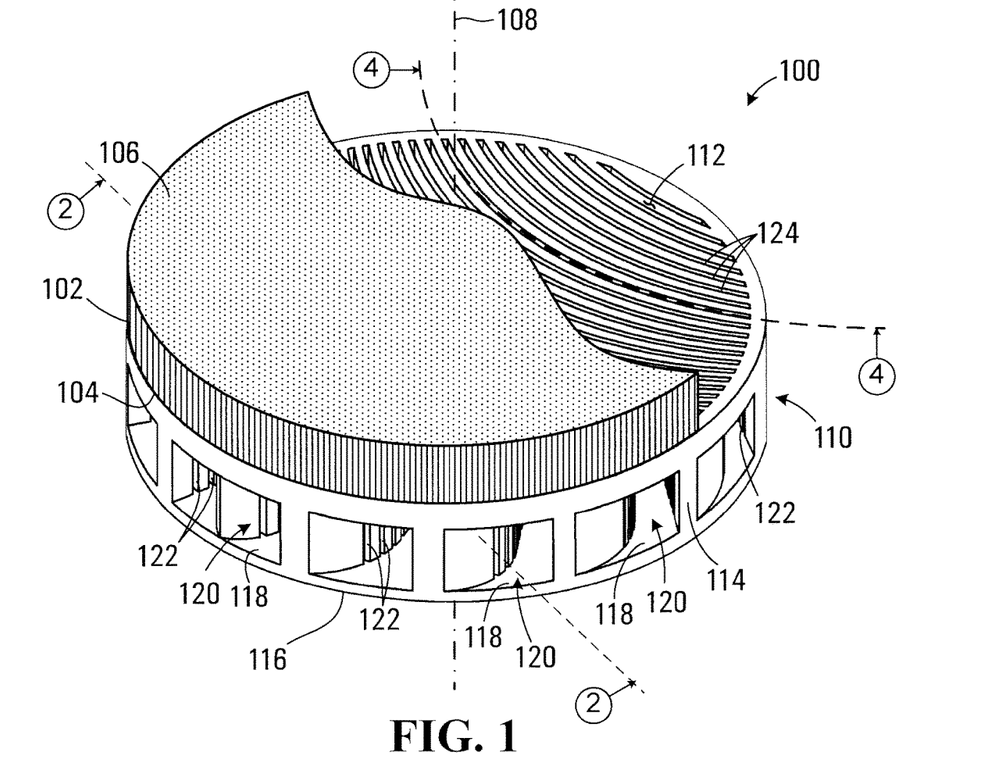
FIG. 1 is a perspective view of an apparatus for exchanging heat with a fluid according to a first disclosed embodiment.

Referring to FIG. 1, an apparatus for exchanging heat with a fluid according to a first disclosed embodiment is shown generally at 100. The fluid may be a gas or a liquid. The apparatus 100 includes a heat exchanger 102 having first and second opposing surfaces 104 and 106. The heat exchanger 102 includes a plurality of flow passages that permit fluid flow between the first and second surfaces 104 and 106 in a substantially axial direction. The axial direction is indicated by the axis 108, which is perpendicular to the first and second surfaces 104 and 106. The apparatus 100 also includes a manifold 110 having an interface surface 112 in thermal contact with the first surface 104 of the heat exchanger. In FIG. 1, the heat exchanger 102 is shown partially cut away to reveal the interface surface 112 below the first surface 104.

The manifold 110 includes a thermally conductive body 114 operable to conduct heat between the interface surface 112 and a distally located heat transmitting surface 116 in a heat flow direction generally aligned with the axial direction 108. The heat transmitting surface 116 is on the underside of the manifold 110 and is fluid impermeable. The manifold 110 further includes a plurality of feed passages 118 extending through the thermally conductive body 114 in a generally transverse direction with respect to the axial direction 108. Each of the feed passages 118 includes a respective inlet 120 for receiving or discharging fluid.

Figure 2:
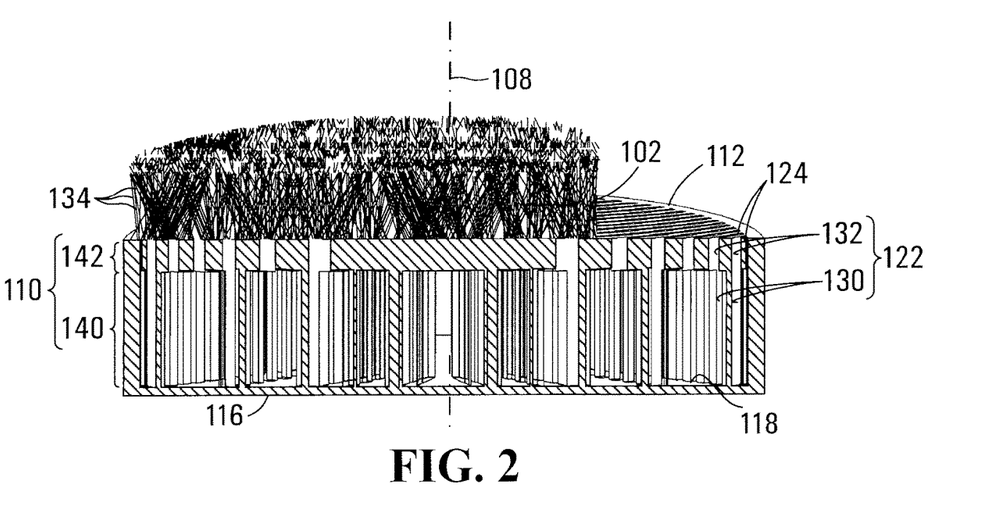
FIG. 2 is a cross-sectional view of the apparatus shown in FIG. 1.

The manifold 110 also includes a plurality of distribution passages 122. Each distribution passage 122 has an end in fluid communication with at least one of the feed passages 118. The plurality of distribution passages 122 have respective openings 124 distributed over the interface surface 112. The manifold 110 is shown in cross section in FIG. 2, with a portion of the heat exchanger 102 removed to reveal the interface surface 112. Referring to FIG. 2, in the embodiment shown the manifold has a feed portion 140 and a distribution portion 142. The distribution passages 122 have portions 130 extending laterally through the feed portion 140 into the feed passages 118 and portions 132 that extend upwardly through the distribution portion 142 between the feed passages 118 and the respective openings 124. The feed passages 118 and the plurality of distribution passages 122 are operable to direct fluid flow to or from the heat exchanger 102 via the openings 124 across the surface 112. In operation the distribution passages 122 are configured to cause a change in fluid flow direction between a transversely directed flow in the feed passages 118 and an axially directed flow at the openings 124 of the distribution passages 122. The fluid flow may undergo a periodic change in direction while flowing through the apparatus 100 and in one embodiment a frequency associated with the periodic change in direction may be greater than about 250 Hz. In other embodiments, fluid flow through the apparatus 100 may either be received at the inlets 120 of the feed passages 118 and discharged from the second surface 106 of the heat exchanger 102 or may be received at the second surface and discharged through the inlets of the feed passages.

Heat Exchanger

The heat exchanger 102 is fabricated from a permeable material having high thermal conductivity. In the embodiment shown in FIG. 2 the heat exchanger material includes a plurality of fibers 134 that are oriented in a direction generally aligned with the axis 108. The fibers 134 may be copper or carbon fibers.

In one embodiment the plurality of initially discrete fibers 134 may be electro-flocked onto the interface surface 112. In electro-flocking, the interface surface 112 is coated with a conductive paste and the manifold 110 is placed in a flocking chamber and electrically grounded. The discrete fibers 134 in a tray are electrically charged by an electric field aligned with the axis 108 causing the fibers 134 to fly through the chamber and to embed in the paste on the interface surface 112. The manifold 110 is then heated in an oven to complete the bond between the fibers and the paste. Electro-flocking produces a generally uniform density but random fiber distribution across the interface surface 112 with the fibers have varying angles to the axis 108 while being generally aligned in the direction of the axis. Electro-flocking of carbon or copper fibers may be used to produce an ultra-compact heat exchanger 102 having a heat transfer area per unit volume of greater than about 10000 m²/m³. The resulting interstitial spaces between fibers of the flocked fiber material provide the plurality of flow passages permitting fluid flow between the first and second surfaces 104 and 106 in the direction of the axis 108.

Gaseous fluids in particular have relatively poor conductivity, thus requiring a large heat exchange surface area and small fluid passages within the heat exchanger 102. Flow and heat exchange properties through the passages of a heat exchanger 102 may be characterized in terms of hydraulic radius $r_h$:

$$r_h = \frac{A}{P}, \qquad \text{Eqn 1}$$

where:
A is the cross sectional flow area of the passage; and
P is the wetted perimeter of the passage.

Smaller hydraulic radius $r_h$ is associated with improved heat exchange, however real gases also have non-zero viscosity and thus suffer from viscous dissipation which increases with decreasing $r_h$. In addition, oscillating fluid flows also have associated pressure oscillations with commensurate temperature oscillations causing thermal relaxation losses which may also be a source of energy dissipation.

For oscillating gas flow the thermal interaction between the gas in the passages of the heat exchanger 102 and heat exchange surfaces that define the passages is dependent on the distance between the gas and the heat exchanging surfaces relative to a, thermal characteristic length $\delta_k$. The thermal characteristic length $\delta_k$ is given by:

$$\delta_k = \sqrt{\frac{2k}{\omega \rho c_p}}, \qquad \text{Eqn 2}$$

where k is the gas thermal conductivity, ρ is the gas density, and $c_p$ is the gas heat capacity. The characteristic length $\delta_k$ thus decreases with increasing operating frequency (ω) and increasing density.

Portions of gas much closer than a thermal characteristic length $\delta_k$ to a heat exchange surface can readily exchange heat with the surface and thus remain isothermal. Portions of gas much further away from the heat exchange surface than the thermal characteristic length $\delta_k$ do not exchange heat with the surface and thus undergo adiabatic temperature oscillations. These isothermal and adiabatic portions of gas do not have any associated thermal relaxation losses since for the isothermal gas portion the temperature difference between the gas and the heat exchange surface is zero and for the adiabatic gas portion the heat flow is zero. However for a remaining layer of gas approximately $\delta_k$ away from the heat exchange surface and $\delta_k$ thick there is partial heat exchange. Since neither the heat flow nor the temperature difference for this remaining portion of gas is zero there is entropy generation and hence losses, and more specifically thermal relaxation losses.

For thermoacoustic or Stirling cycle transducers the inventors have found that best performance may be obtained when the hydraulic radius $r_h$ of the fluid flow passages through the heat exchanger 102 is approximately equal to the gas thermal characteristic length $\delta_k$ i.e.:

$$r_h \approx \delta_k. \qquad \text{Eqn 3}$$

Given the large surface area needed to conduct and transfer the heat in or out of the working gas if the hydraulic radius $r_h$ of the passages were much larger than $\delta_k$, relaxation losses would be prohibitive. If however the exchanger hydraulic radius $r_h$ were much smaller than $\delta_K$ the viscous losses would be prohibitive. For a thermoacoustic transducer having helium working gas and operating at 500 Hz frequency, a working gas pressure of 120 Bar, a cold side temperature of 300° K, and a hot side temperature of 1000° K, the thermal characteristic length $\delta_k$ is about 30 μm for the cold heat exchanger and about 85 μm for the hot heat exchanger. Heat exchangers of flocked fibers 14 using either 23 μm diameter copper fibers or 10 μm diameter carbon fibers have been found to produce heat exchangers 102 having hydraulic radii within this range of $\delta_k$ values. In one embodiment the fibers 134 may be between about 0.5 mm and 2 mm long and the first and second opposing surfaces 104 and 106 of the heat exchanger 102 would then be spaced apart by about the same dimension.

In some embodiments, it may be desirable for the second surface 106 to be compliant to facilitate thermal contact for coupling between the second surface and an external fluid flow element (not shown). For example in thermoacoustic transducers the second surface 106 may be placed in contact with a thermal regenerator and the ability of the fibers 134 to deform somewhat when stacked together with the regenerator significantly simplifies assembly and ensures adequate thermal contact. The fibers 134 thus have the advantage of providing a compliant second surface 106, when required.

In other embodiments high thermal conductivity fluid permeable material such as a sintered powder, a wire felt, a metal foam, a ceramic foam, a woven screen, or a bonded plurality of patterned foils may be used to fabricate the heat exchanger 102. For example, sintered copper felts having a 9.6% fill of 20 μm diameter wires is commercially available and provide an acceptable hydraulic radius $r_h$. The sintered copper felt is not very compliant and wires are not generally aligned to an axis, but such materials may be useful in some applications. Alternatively, a plurality of thin copper foils may be chemically etched to produce openings in each foil. The foils may then be stacked and bonded such that the openings align to provide passages through the stacked foils. Current limitations on chemical etching would require foil thickness in the same range as the passage dimension (for example 50 µm) and thus a relatively large number of thin foils would need to be stacked and bonded to make up the heat exchanger 102.

Figure 3:
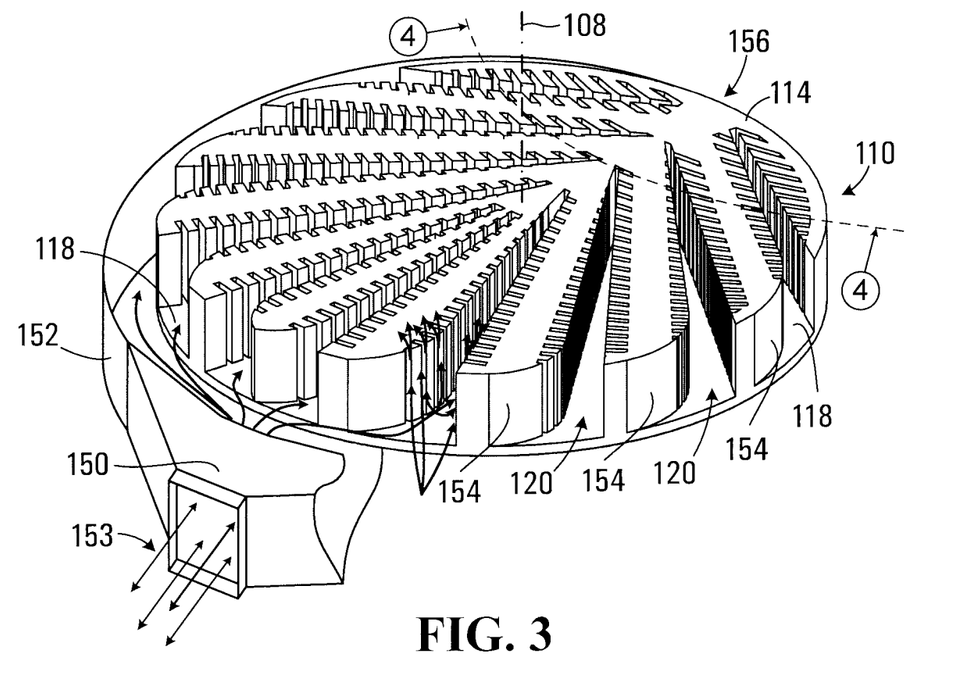
FIG. 3 is a partially cut away perspective view of a feed portion of the apparatus shown in FIG. 1.

Advantageously, heat flow in the apparatus 100 is via the shorter (i.e. axial) dimension of the apparatus, which takes advantage of the larger cross-sectional area and the short distance in this direction to minimize the temperature drop due to the heat flux and finite thermal conductivity of the material Feed Passages The manifold 110 is shown in FIG. 3 with portions 132 of the distribution passages 122 (shown in FIG. 1) cut away to reveal the plurality of feed passages 118. The inlets 120 of the feed passages 118 are located to one side of the manifold 110 and the feed passages extend into the body 114 and reduce in width toward their respective ends to provide a uniform distribution and uniform velocity of fluid flow to the plurality of distribution passages 122 and thus through the openings 124 at the interface surface 112. In this embodiment the feed passages 118 thus have a cross sectional area that varies along a transverse length of the feed passage. In some embodiments, the cross sectional area of the feed passages 118 may also vary between adjacent feed passages to cause a generally uniform feed to the distribution passages 122 and a generally uniform flow through the openings 124 at the interface surface 112. Each feed passage 118 has a plurality of distribution passages 122 in fluid communication along the transverse length of the feed passage and the distribution passages extend into the body 114 of the manifold 110 in a lateral direction with respect to the feed passages.

The thermally conductive body 114 is defined by remaining portions of the manifold that are not occupied by the feed passages 118 and the distribution passages 122 (i.e. the hatched areas in the cross section shown in FIG. 2). In one embodiment the thermally conductive portion of the body may include at least about 30% of a cross-sectional area of the manifold 110. The thermally conductive body 114 may also be configured to withstand forces due to an operating pressure difference across the impermeable heat transmitting surface 116. The apparatus 100 has an additional advantage when the fluid is highly pressurized in that the manifold 110 has feed passages 118 that extend into thermally conductive body 114 in a generally transverse direction, leaving a significant portion for transfer of heat and for structural support.

The embodiment of the manifold 110 shown is configured to be fed by a fluid port 150. The fluid port 150 is peripherally disposed on an enclosure 152 to one side of the manifold 110 and receives a fluid flow 153 which is directed to the inlets 120 of respective feed passages 118. The fluid port 150 may be flared to ensure the fluid is fed generally uniformly to the plurality of feed passages 118. The inlets 120 of the feed passages include flared regions 154 for smoothly directing the fluid flow 153 between the port 150 and the feed passages 118. The fluid flow along each feed passage 118 separates to feed into the distribution passages 122 and changes direction from a generally transversely oriented flow into multiple axially oriented flows as shown in FIG. 3. The inlets 120 of the feed passages each have an inlet cross sectional area sized to cause a generally uniform distribution of the fluid between the plurality of feed passages 118.

In the embodiment shown in FIG. 3, the inlets 120 of the feed passages 118 are disposed about a portion of a periphery of the manifold 110 while a further peripheral portion 156 of the manifold does not have any openings. The manifold 110 is thus configured to receive or discharge flow from the fluid port 150 located to the side away from the peripheral portion 156. The second surface 106 of the heat exchanger acts as a further port for receiving or discharging fluid from the heat exchanger. In other embodiments the apparatus 100 may include a further enclosure and fluid port (not shown) for channeling fluid flow to or from the second surface 106 of the heat exchanger 102.

In other embodiments, fluid flow through the apparatus 100 may either be received at the inlets 120 of the feed passages 118 and discharged from the second surface 106 of the heat exchanger 102 or may be received at the second surface and discharged through the inlets of the feed passages.

Figure 4:
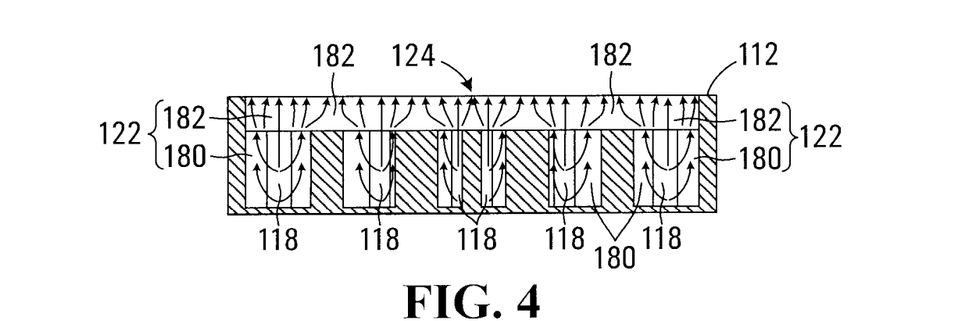
FIG. 4 is a cross-sectional view of the apparatus of FIG. 1 taken along a curved cross-section line 4-4 shown in FIG. 1 and FIG. 3.

Referring to FIG. 4, a portion of the plurality of distribution passages 122 are shown in a cross-section taken along a curved cross-section line 4-4 in FIG. 3. In this embodiment, the distribution passages 122 have portions 180 adjacent to the feed passages 118 and a merged portion 182 in fluid communication with a plurality of distribution passage portions 180. A lateral width of the distribution passages 122 thus increases above the feed passages 118 and the distribution passage portions 180 below the interface surface 112 merge into a common portion 182 that provides one of the openings 124 at the interface surface 112. As best shown in FIG. 1, the openings 124 associated with the plurality of distribution passages 122 form a grill pattern extending across the interface surface 112. In this embodiment the openings 124 and the underlying distribution passages 122 are curved due to the feed passages 118 being oriented inwardly on the manifold 110 as shown. A sufficiently large number of openings 124 are distributed across the interface surface 112 to provide a generally uniform fluid flux to or from the interface surface 112. The plurality of distribution passages 122 may also be sized to cause a generally uniform flow through the distribution passages. The distribution passages 122 also have a greater width in the lateral direction than a transverse direction along the feed passages and the openings 124 are thus narrow. For a fiber heat exchanger 102, the distribution passages 122 need to be narrow enough so that the fibers can cover the openings 124 with a canopy of fibers. It is also desirable to keep the interface surface 112 area as large as possible for fiber attachment so as not to reduce fiber density, which is another advantage of using narrow distribution passages 122.

Figure 5:
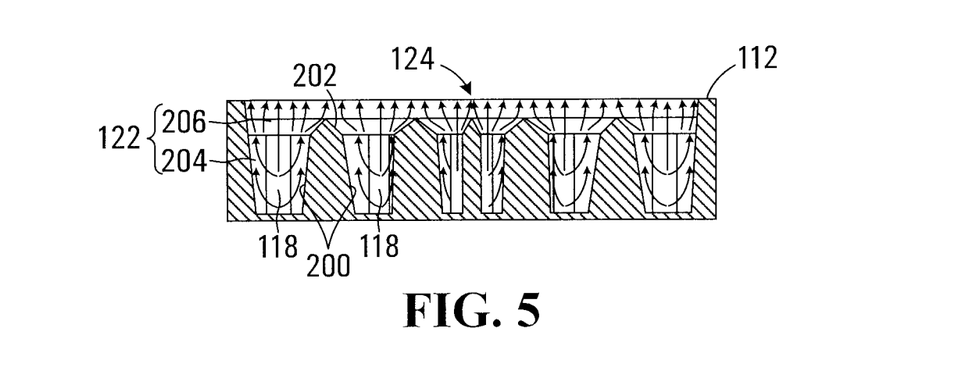
FIG. 5 is a cross sectional view of an alternative embodiment of the apparatus shown in FIG. 1.

Referring to FIG. 5, in an alternative embodiment the distribution passages 122 may have walls 200 and 202 that taper outwardly from a lower end of the feed passages 118 to the opening. In the embodiment shown, the wall 200 of a portion 204 of the distribution passages adjacent the feed passages 118 has a shallower taper than the wall 202 at a portion 206 extending toward the opening 124.

Advantageously, the configuration of the feed passages 118 and distribution passages 122 within the manifold represents a practical compromise between heat transfer and fluid flow that distributes the fluid flow to substantially the entire area of the second surface 104 of the heat exchanger providing a uniform fluid flow through the heat exchanger. Other fluid flow arrangements, such as feeding the fluid transversely through the heat exchanger 102, result in substantially less uniform fluid distribution.

Figure 6:
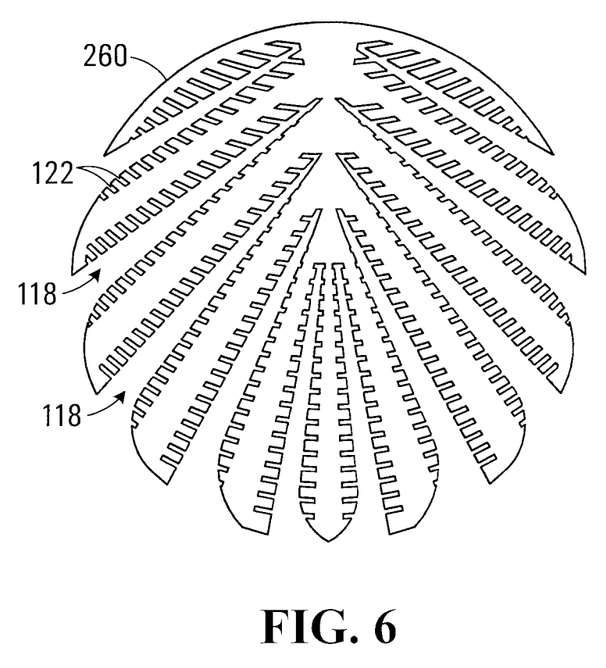
FIG. 6 is a plan view of a foil layer for fabricating the feed portion of the apparatus shown in FIG. 1.

The manifold 110 has a complex structure of feed passages 118 and distribution passages 122, and may be difficult to fabricate using conventional machining techniques. Referring to FIG. 6, in one embodiment a thin foil layer 260 may be chemically etched to pattern the foil layer to define the plurality of distribution passages 122 and plurality of feed passages 118. The foil layer 260 may be a thermally conductive material such as copper, and in one embodiment may be about 250 µm thick. A plurality of the thin foil layers 260 may then be stacked and diffusion bonded to build up the feed portion 140 of the manifold 110 (as shown in FIG. 2). In practice the plurality of foil layers 260 may be fabricated on thin copper sheets and then detached and stacked to form the desired overall thickness of the feed portion 140. The distribution portion 142 of the manifold 110 may be fabricated in a similar manner to the feed portion 140. In other embodiments the manifold may be fabricated by depositing thermally conductive material (for example a copper powder) using a 3D printer.

Where the heat exchanger 102 comprises a flocked plurality of fibers 134, a conductive paste coating may be applied over the interface surface 112 without filling the openings 124. The fibers 134 may then be electro-flocked directly into the paste before firing the apparatus 100 in a vacuum furnace to anchor roots of the fibers to the interface surface 112. This operation produces a strong and low thermal resistance bond of the fiber roots to the interface surface 112.

In one embodiment the apparatus 100 may be configured for use in a Stirling cycle transducer or thermoacoustic transducer, such as described in commonly owned International patent application publication WO2014/043790 entitled "THERMOACOUSTIC TRANSDUCER APPARATUS INCLUDING A TRANSMISSION DUCT", which is hereby incorporated herein by reference in its entirety. The apparatus 100 may be used to implement either or both of the disclosed first and second heat exchangers in WO2014/043790. Accordingly, the apparatus 100 may be disposed with the surface 106 of the heat exchanger 102 in thermal contact with a thermal regenerator, such as disclosed in WO2014/043790. A regenerator generally includes first and second interfaces and the first interface may be in thermal contact with the surface 106 a first apparatus 100 and a second apparatus 100 as generally disclosed above may have its respective heat exchanger surface 106 disposed in thermal contact with the second interface of the regenerator.

In one embodiment, heat exchange between two fluids may be realized by putting two of the apparatus 100 in a back-to-back configuration with the heat transmitting surfaces 116 of each apparatus being in contact with each other. One of the apparatuses 100 may receive a first fluid (for example a gas to be cooled or heated) while the other apparatus may receive a second fluid (such as a liquid coolant). Heat is transferred from the higher temperature fluid to the lower temperature fluid through the heat transmitting surfaces 116.

Figure 7:
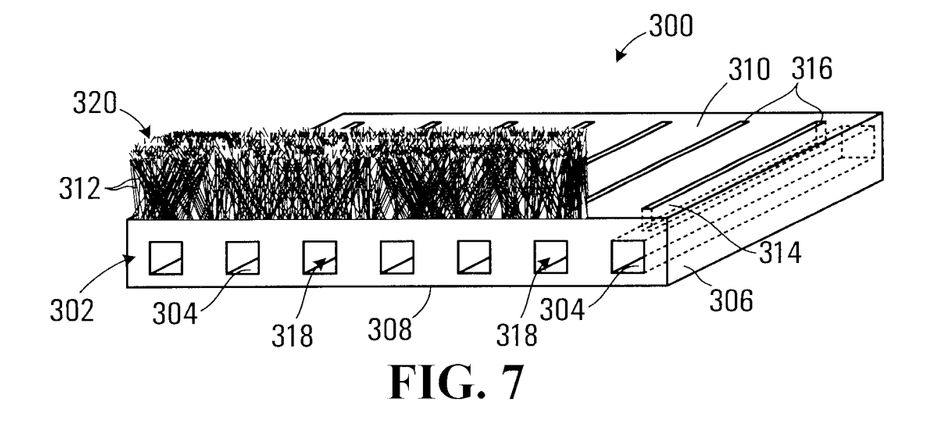
FIG. 7 is a perspective view of an alternative embodiment of an apparatus for exchanging heat with a fluid.

The apparatus may further be useful in other applications where a compact or ultra-compact heat exchanger is required, such as cooling of electrical components and/or mechanical components. Referring to FIG. 7, an alternative embodiment of an apparatus for exchanging heat with a fluid is shown at 300. The apparatus 300 includes a manifold 302 having a plurality of feed passages 304 extending transversely into a body 306 of the manifold, each having an inlet 318. The manifold 302 has a heat transmitting surface 308 for receiving heat from a component being cooled. The manifold 302 also includes an interface surface 310 having heat exchange fibers 312 electro-flocked to the interface surface. Only a portion of the fibers 312 are shown in FIG. 7 and the interface surface 310 would generally be covered by fibers. Each feed passage 304 is in communication with a distribution passage 314 (shown in broken lines for the rightmost feed passage in FIG. 7). Each distribution passage 314 has an opening 316 at the interface surface 310. The body 306 of the manifold 302 conducts heat from the heat transmitting surface 308 to the interface surface 310 in a direction generally normal to the heat transmitting surface 308. The heat exchange fibers 312 are thermally coupled to the interface surface 310 and conduct heat axially along the fibers. Fluid flow is received at the inlets 318 and channeled through the feed passages 304 in a transverse direction. The fluid flow direction changes to a generally normal flow direction at the distribution passages 314 and is discharged through the openings 316 through heat exchange fibers 312. The fluid flow interacts with the plurality of fibers 312, which have a large heat transfer surface area.

Many conventional compact heat exchangers have a heat exchange layer in direct contact with or bonded to a surface of the component being cooled and a fluid distribution structure on a distal side of the heat exchanger. Typically the fluid distribution structure has interleaved transverse passages, some of which act as feed passages for directing fluid flow through the heat exchange layer and others that act as discharge passages for collecting and discharging fluid from the heat exchange layer. Fluid flow is thus through the heat exchange layer between feed passages and discharge passages in a direction predominantly transverse to the heat flow direction.

The configuration of the feed passages 304 and distribution passages 314 in the apparatus 300 has the advantage of reducing fluid flow distances over the typical interleaved fluid distribution structure, thus reducing flow friction losses. As noted above the structural integrity of the manifold 110 shown in FIG. 1 also has an advantage over interleaved fluid distribution structures, which must accommodate both feed and discharge passages in a single layer and are usually correspondingly weaker due to interleaved or crossed fluid flow passages. This is particularly useful when the manifold 110 must withstand an elevated working pressure across the apparatus.

The apparatus 300 may be used to cool a semiconductor device, such as a microprocessor or other integrated circuit. The heat transmitting surface 308 may be placed in contact with a hot surface of the semiconductor device and slightly pressurized cooling air may be delivered to the inlets 318 of the feed passages 304. The cooling air would flow through the heat exchange fibers 312 and would be discharged at an exposed surface 320 of heat exchanger. Alternatively, the cooling fluid may be a liquid, and in this case the liquid would be collected by enclosing the heat exchange fibers 312 and providing a conduit for collecting the discharged cooling liquid.

While specific embodiments have been described and illustrated, such embodiments should be considered illustrative of the invention only and not as limiting the invention as construed in accordance with the accompanying claims.

What is claimed is:

1. An apparatus for exchanging heat with a fluid, the apparatus comprising:
   a heat exchanger having first and second opposing surfaces and a plurality of flow passages that permit fluid flow between the first and second surfaces in a substantially axial direction, wherein the axial direction is perpendicular to the first and second surfaces, and wherein the heat exchanger comprises an ultra-compact heat exchanger material;
   a manifold having an interface surface in thermal contact with the first surface of the heat exchanger, the manifold comprising:

a thermally conductive body operable to conduct heat between the interface surface and a distally located heat transmitting surface in a heat flow direction generally aligned with the axial direction, the heat transmitting surface being fluid impermeable;

a plurality of feed passages extending through the thermally conductive body in a generally transverse direction with respect to the axial direction, each feed passage having an inlet for receiving or discharging the fluid; and a plurality of distribution passages, each distribution passage having an end in fluid communication with at least one of the plurality of feed passages and having an opening at the interface surface, the respective openings of the plurality of distribution passages being distributed over the interface surface, the distribution passages being configured to cause a change in fluid flow direction between a transversely directed flow in the feed passages and an axially directed flow at the openings of the distribution passages.

2. The apparatus of claim 1 wherein the heat exchanger material comprises a high thermal conductivity fluid permeable material comprising at least one of:
a sintered powder;
a wire felt;
a metal foam;
a ceramic foam;
a woven screen; and
a bonded plurality of patterned foils.

3. The apparatus of claim 1 wherein the heat exchanger material comprises a plurality of flocked fibers.

4. The apparatus of claim 3 wherein the plurality of flocked fibers are oriented in a direction generally aligned with the axial direction.

5. The apparatus of claim 3 wherein the fibers comprise at least one of carbon fibers and copper fibers.

6. The apparatus of claim 1 wherein the heat exchanger comprises a heat exchanger material selected to provide a compliant second surface, the compliant second surface being operable to facilitate thermal contact for coupling between the second surface and a thermal regenerator.

7. The apparatus of claim 1 wherein the first and second opposing surfaces of the heat exchanger are spaced apart by less than about 2 mm.

8. The apparatus of claim 1 wherein each of the feed passages has a cross sectional area that varies along a transverse length of the feed passage to promote a uniform feed to the distribution passages and to promote a uniform flow through the openings at the interface surface.

9. The apparatus of claim 1 wherein a cross sectional area of feed passages in the plurality of feed passages varies between feed passages to promote a uniform feed to the distribution passages and to promote a uniform flow through the openings at the interface surface.

10. The apparatus of claim 1 wherein each feed passage has a plurality of distribution passages in fluid communication along a transverse length of the feed passage.

11. The apparatus of claim 10 wherein the plurality of distribution passages extend into the thermally conductive body in a lateral direction with respect to the feed passages.

12. The apparatus of claim 11 wherein distribution passages associated with adjacently located feed passages merge below the interface surface such that the respective openings of the merged distribution passages form a grill pattern extending across the interface surface.

13. The apparatus of claim 11 wherein the distribution passages have a greater width in the lateral direction than a transverse direction along the feed passages.

14. The apparatus of claim 1 wherein the manifold further comprises a port peripherally disposed to one side of the manifold for receiving or discharging fluid from the manifold and wherein the inlet of at least some of the feed passages are flared toward the port to smoothly direct fluid between the port and the feed passages.

15. The apparatus of claim 1 wherein the manifold further comprises a port peripherally disposed to one side of the manifold for receiving or discharging fluid from the manifold and wherein the respective inlets of the feed passages each have an inlet cross sectional area sized to cause a uniform distribution of the fluid between the plurality of feed passages and through the openings at the interface surface.

16. The apparatus of claim 1 wherein the respective inlets of the plurality of feed passages are disposed about at least a portion of a periphery of the manifold and further comprising one or more ports in fluid communication with the respective inlets, the one or more ports being operable to receive or discharge fluid from the manifold.

17. The apparatus of claim 16 wherein the second surface of the heat exchanger acts as a further port for receiving or discharging fluid from the heat exchanger.

18. The apparatus of claim 1 wherein the distribution passages are configured to deliver a generally uniform distribution of fluid flow at the interface surface by at least one of:
distributing the plurality of distribution passages across the interface surface to promote a uniform fluid flux at the interface surface; and
sizing respective distribution passages to promote a uniform flow through each of the plurality of distribution passages.

19. The apparatus of claim 1 wherein the openings are regularly spaced across the interface surface.

20. The apparatus of claim 1 wherein at least a portion of the manifold is fabricated from a plurality of stacked and bonded layers of thermally conductive material, each of the plurality of layers being patterned to define portions of the respective passages.

21. The apparatus of claim 1 wherein at least a portion of the manifold is fabricated by depositing thermally conductive material using a 3D printer.

22. The apparatus of claim 1 wherein the thermally conductive body is defined by portions of the body that are not occupied by the plurality of feed passages and the plurality of distribution passages and wherein the thermally conductive body comprises at least 30% of a cross-sectional area of the manifold.

23. The apparatus of claim 1 wherein the thermally conductive body is configured to withstand forces due to an operating pressure difference across the impermeable heat transmitting surface.

24. The apparatus of claim 1 wherein the fluid flow undergoes a periodic change in direction and wherein the plurality of flow passages of the heat exchanger are sized to have a hydraulic radius $r_h$ approximately equal to a gas thermal characteristic length $\delta_k$, the gas thermal characteristic length being dependent on a frequency associated with the periodic change in direction of the fluid flow.

25. The apparatus of claim 24 when the frequency associated with the periodic change in direction is greater than 250 Hz.

26. The apparatus of claim 1 used in one of:
a Stirling cycle transducer;
a thermoacoustic transducer;
a cooler for cooling a mechanical device; and
a cooler for cooling an electrical circuit component.

27. A system for transferring heat between a first fluid and a second fluid, the system comprising:
 a first apparatus as defined in claim 1 configured to exchange heat with the first fluid;
 a second apparatus as defined in claim 1 configured to exchange heat with the second fluid; and
 wherein the heat transmitting surface of the first apparatus is disposed in thermal contact with the heat transmitting surface of the second apparatus.

28. The apparatus of claim 1 further comprising:
 a thermal regenerator disposed in thermal contact with the second surface of the first heat exchanger.

29. The apparatus of claim 28 wherein the regenerator comprises first and second interfaces, the first interface being in thermal contact with the second surface and further comprising a second apparatus for exchanging heat with a fluid, the second apparatus having a respective second surface disposed in thermal contact with the second interface of the regenerator.

* * * * *